United States Patent [19]

Diem

[11] Patent Number: 5,076,886

[45] Date of Patent: Dec. 31, 1991

[54] INCREMENTAL TUNE ETCH APPARATUS AND METHOD

[75] Inventor: Michael Diem, Anaheim, Calif.

[73] Assignee: Rockwell International Corporation, El Segundo, Calif.

[21] Appl. No.: 605,588

[22] Filed: Oct. 29, 1990

[51] Int. Cl.⁵ .................. H01L 21/306; B44C 1/22
[52] U.S. Cl. .................................. 156/642; 165/651; 165/654; 165/662; 165/345
[58] Field of Search ............... 156/639, 642, 651, 654, 156/655, 662, 345; 252/79.1

[56] References Cited

U.S. PATENT DOCUMENTS

| | | | |
|---|---|---|---|
| 3,105,784 | 10/1963 | Topas | 156/651 |
| 3,549,439 | 12/1970 | Kaveggia et al. | 156/345 |
| 4,426,251 | 1/1984 | Ida et al. | 156/656 |
| 4,436,580 | 3/1984 | Boyd et al. | 156/639 X |
| 4,734,151 | 3/1988 | Ives et al. | 156/642 X |

*Primary Examiner*—William A. Powell
*Attorney, Agent, or Firm*—H. Fredrick Hamann; George A. Montanye; David J. Arthur

[57] ABSTRACT

A method of performing a liquid etching operation on a wafer surface includes placing the wafer into an etch container, filling the etch container with a liquid etch solution, retaining the etch solution in the etch container for a short predetermined length of time, releasing the etch solution from the etch container, and then repeating the above steps without replacing the wafer, to obtain a series of short etch cycles having collectively a predictable average etch rate.

17 Claims, 2 Drawing Sheets

INCREMENTAL TUNE ETCH APPARATUS AND METHOD

This invention was made with Government support under Contract No. F33615-87-C-5218 awarded by the Air Force. The Government has certain rights in this invention.

BACKGROUND OF THE INVENTION

During the processing of wafers for forming semiconductor chips or radiation detectors, the surface of the wafer may need to be etched to remove imperfections, to provide a smooth surface, or to adjust the thickness of the wafer surface material. Such surface removal may be done mechanically through an action such as lapping, or may be done chemically by etching the surface. Etching may be accomplished by plasma etching, gas etching, or by liquid etching.

In applications such as the preparation of wafers for forming infrared detectors, the after-processing thickness of the wafer surface material may be important to the ultimate use of the devices. For example, after liquid phase epitaxy (LPE) growth, a certain amount of the Mercury/Cadmium/Telluride (MCT) layer must be removed by etching, to achieve a desired cutoff wavelength of radiation absorption. Different target wavelengths require different amounts of etching. Thus, it is desired to "tune" the detectors by adjusting the wavelength.

For the above and other reasons, it is therefore important in many processing operations to accurately control the amount of wafer surface material removed in a lapping or etching operation. In a chemical etch process, the amount of material removed during the etching operation is dependent upon, among other things, the amount of time that the chemical etchant is in contact with the wafer surface material and the etching rate for that etchant. However, in a liquid etch process, the etch rate may not be a constant as a function of time during the etching operation, which makes determining the amount of material removed during the etching operation difficult to predict. For example, when etching MCT with a liquid bromine-methanol solution (Br2/MeOH), the solution is poured over an MCT film for etching the MCT film, the immediate reaction is a rapid etching of the film. Just above the surface of the film, the solution quickly becomes depleted of bromine, and the etching reaction rate decreases, as illustrated in FIG. 1.

Because of this changing etch rate, and the nonuniform film removal rate, determining the endpoint of an etching operation is difficult. After etching, the part must be removed from the etch apparatus, and examined to determine the thickness of the remaining MCT film. If too much film remains, the part must be reinstalled in the etching apparatus, and another etching operation performed, a time consuming operation. However, examination may reveal that the part has been over-etched, leaving too little MCT, and requiring that the part be rejected and scrapped.

SUMMARY OF THE INVENTION

The present invention is a method of etching a wafer surface, and the apparatus for performing that method. The method includes placing the wafer into an etch container, filling the etch container with a liquid etch solution, retaining the etch solution in the etch container for a predetermined length of time, and releasing the etch solution from the etch container, then repeating steps (b) through (d) without replacing the wafer. The predetermined length of time is preferably the amount of time necessary for the etch solution to remove approximately 0.5 micron of the wafer surface.

The apparatus includes an etch container for holding a wafer, a reservoir for holding a quantity of liquid etch solution, a first conduit connecting the reservoir and the etch container, a valve on the first conduit. The apparatus additionally includes a second conduit for directing the etch solution from the etch container, and a valve on the second conduit. A timer/counter is connected to the first and second valves to control the opening and closing of those valves.

DETAILED DESCRIPTION OF THE PREFERRED EMBODIMENT

Figure 1:
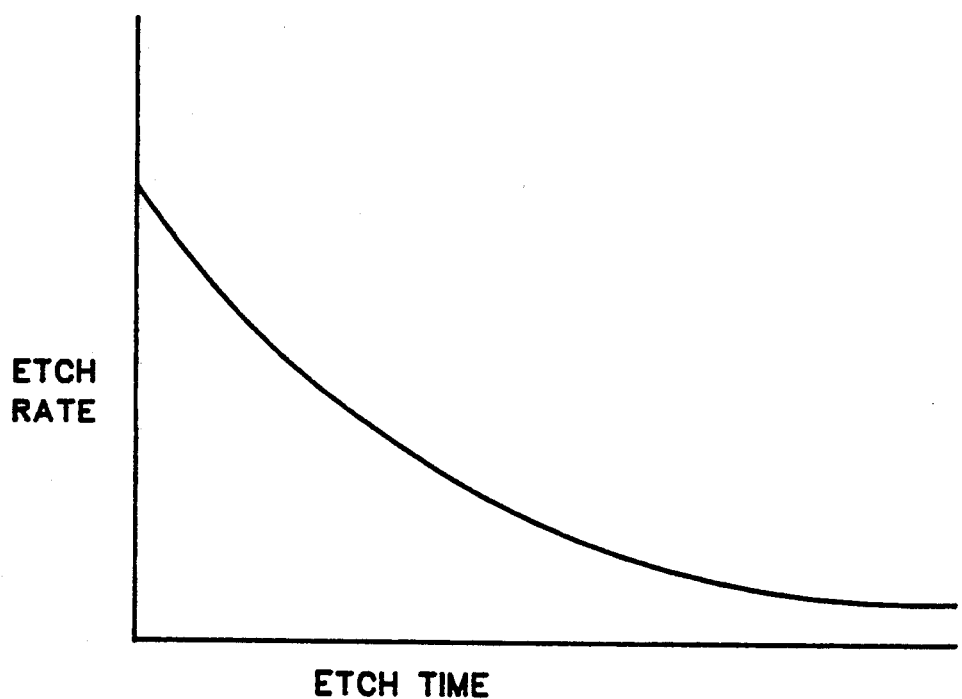
FIG. 1 illustrates the decreasing etch rate as a function of time for a liquid etch operation.
Figure 2:
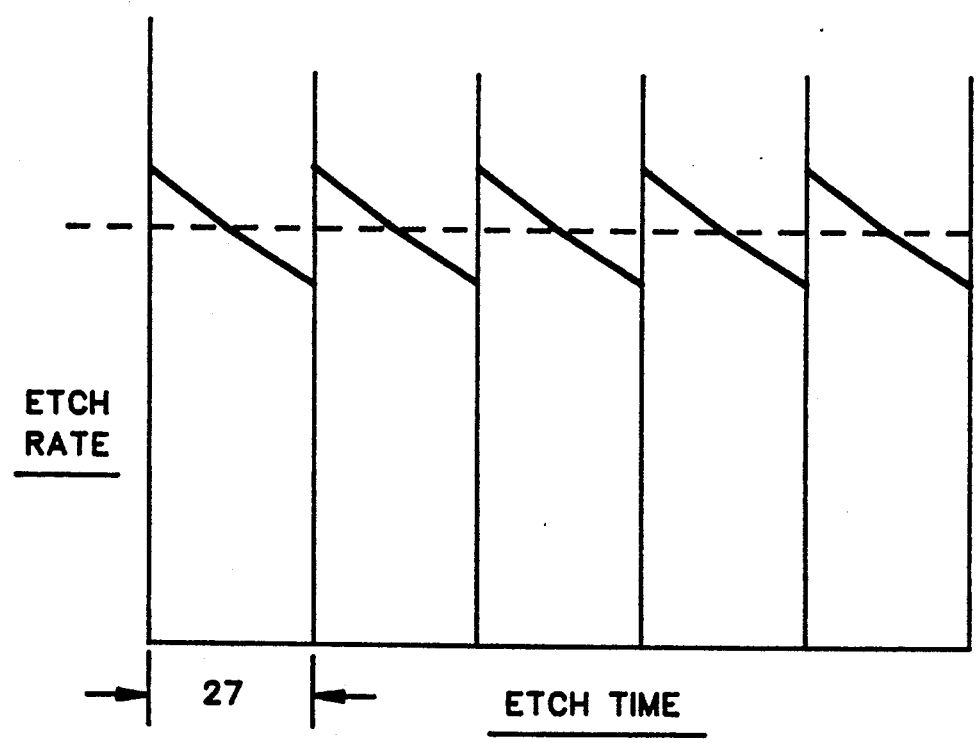
FIG. 2 illustrates obtaining an average etch rate using the invention.

According to the present invention, a series of discrete short etches with quick cycling provides an overall average etch rate that is constant, as shown in FIG. 2. This average etch rate allows accurate prediction of the endpoint for an etching operation, so that the remaining thickness of the MCT film and cutoff wavelength is appropriate for accurate tuning of the detector that is to be formed.

Figure 3:
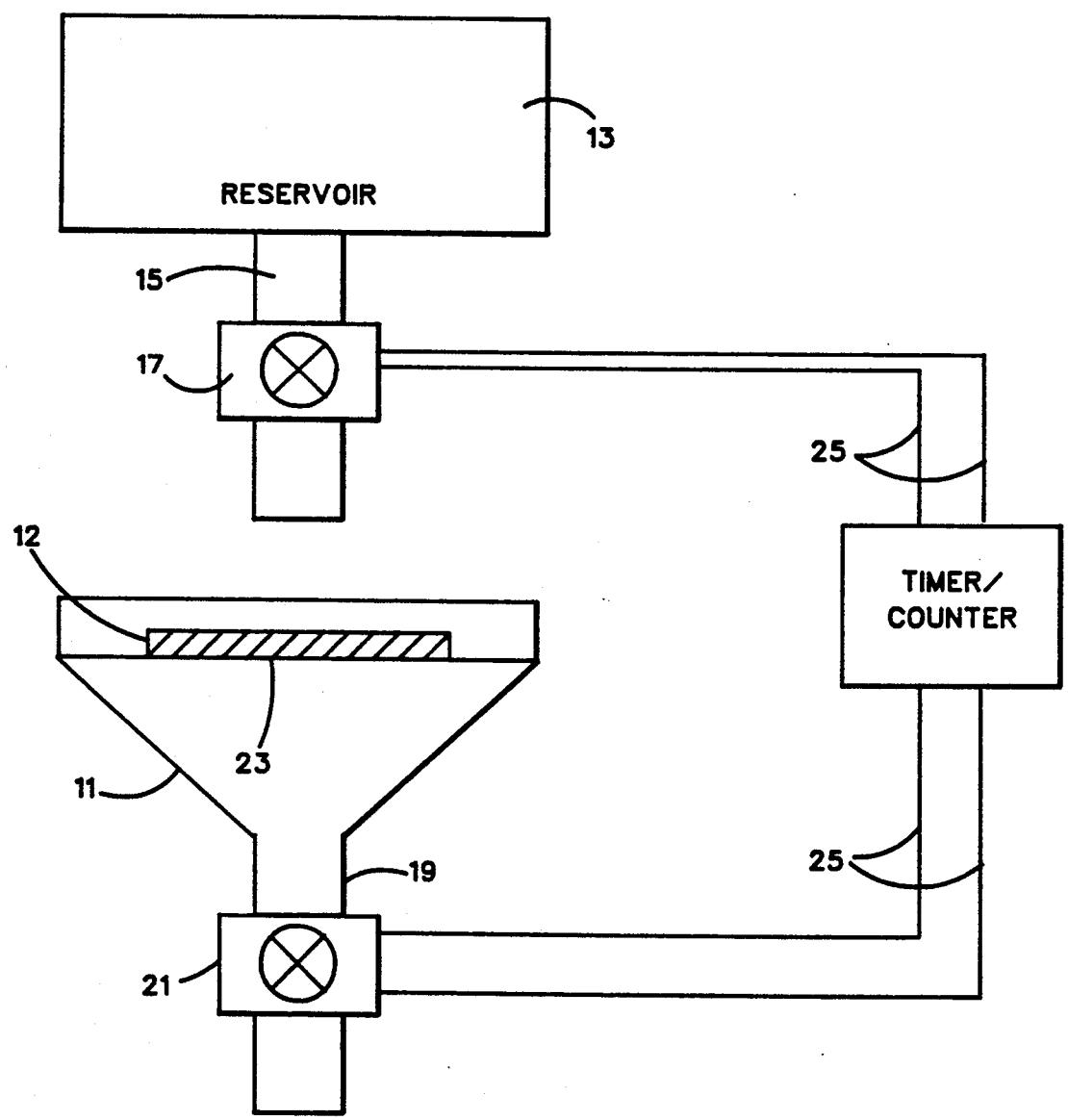
FIG. 3 illustrates one embodiment of the apparatus of the present invention.

The method will be described in conjunction with the exemplary apparatus shown in FIG. 3. As shown, an etch container or receptacle 11 is of a size sufficient to receive one or more wafers to be processed 12. A reservoir 13 holds the liquid etching solution or etchant. An inlet conduit 15 connects the reservoir 13 and the etch container 11 to direct etchant from the reservoir to the etch container. An inlet valve 17 in that conduit can be used to control the flow of the etch solution.

For etching an MCT film on the wafer surface, the reservoir 13 may contain a bromine-methanol solution, such as one containing 1½% bromine in the solvent methanol. Other concentrations of bromine-methanol may be used, depending on the desired etch rate. A higher concentration of bromine will result in a faster etch rate, while a lower concentration will provide a slower etch rate. The etch rate is also affected by the temperature at which the process is conducted. The etch rate should be slow enough to provide the appropriate amount of control on the etching process, yet fast enough to enable the overall operation to proceed at an appropriate rate.

Solvents other than methanol may also be used in the process of etching MCT films, such as ethylene glycol. An ethylene glycol based etching solution is thicker than a methanol based solution, and will produce a slower etch rate. In addition, the filling and draining operations to be described may take more time with an ethylene glycol based solution than with a methanol based solution.

A drain conduit 19 is connected to the etch container for directing spent etch solution from the etch container for appropriate disposal. A second valve 21 is connected to the drain conduit to control the emptying of solution from the etch container.

The etch container includes a perforated surface 23 on which the wafer to be etched 12 is placed, so that the etch solution drains away from the wafer quickly and completely.

The reservoirs, the tubing or conduits, and the valves are made of a material that will not react adversely with the etching solution being used in the system. For example, a suitable material for use with the bromine-methanol etch solution is a material coated with an inert, tough, insoluble polymer such as Teflon.

A timer/counter or other control mechanism is coupled to the valves to control those valves and thus control the filling and draining of the etch container. For example, the valves may be solenoid controlled and connected to the timer/counter by electrical connections 25.

In operation, the reservoir 13 is filled with an etch solution, such as the bromine methanol solution previously mentioned. A wafer 12 having a surface to be etched is placed on the perforated bottom surface of the etch container 11, with the surface to be etched on top. The inlet valve 17 is opened while holding the drain valve 21 closed to fill the etch container with etch solution. After the etch container is filled, the inlet valve 17 is closed, and the etch solution is allowed to stand in the etch container for a predetermined length of time while etching of the wafer surface takes place. At the end of this length of time, the drain valve 21 is opened to quickly drain the etch container. After the etch container has been drained, the drain valve 21 is closed, and the inlet valve 17 is again opened to refill the etch container with a fresh charge of etch solution, and the process is repeated.

This process of filling, holding, and draining the etch container is repeated over a number of cycles 27 to obtain the average etch rate as shown in FIG. 2. The fill and drain times during which the inlet valve and the drain valve respectively are opened are kept as short as possible to minimize the gaps between etching segments. Excessive times between the etching steps will alter the average etch rate. In addition, it is important that the wafer surface being etched not dry out during the etching operation. The time that each of the inlet and drain valves needs to be opened for the appropriate quantity of etch solution flow depends on the throat sizes of valves and the viscosity of the solution.

To assist in the rapid draining of the etching solution from the etch container, a vacuum may be applied to the drain conduit 19.

Depending on the exact composition of the surface to be etched and the etching solution, the etching time is determined experimentally to be sufficient to remove a small amount of material so that between 6 and 10 etching segments are required to remove the total amount of material desired to be removed. For example, during the etching of an MCT film, it may be desired to remove between 3 and 5 microns of the film surface, depending on the desired end thickness of the MCT layer. Each etch segment should be designed to remove approximately ½ micron of the MCT material. With a 1.5% solution of bromine in methanol, this time is between approximately 4 and 10 seconds.

Keeping each etch segment relatively short minimizes the effect of the deviation in the etch rate. Additionally, removing just a small amount of surface material with each etch segment facilitates the use of the method in the process of "tuning" the detectors to be formed. Leaving different thicknesses of surface material involves simply changing the number of etch segments performed on the wafer. There is no need to experimentally determine, for each desired thickness, the length of time the wafer must be immersed in the etch solution.

The operation of the timer/counter to control the valves can be automated using conventional techniques. Once the average etch rate has been determined, the number of segments or cycles necessary to remove the desired amount of material can be determined and programmed into the timer/counter. The timer/counter then repeats the process automatically until the counter reaches zero (0).

At the conclusion of the etching operation made up of the numerous etch cycles, the operator can remove the wafer and inspect it in any conventional known manner.

I claim:

1. A method of etching a wafer surface comprising:
   (a) placing said wafer into an etch container;
   (b) filling said etch container with a liquid etch solution;
   (c) retaining said etch solution in said etch container for a predetermined length of time;
   (d) releasing said etch solution from said etch container;
   (e) repeating steps (b) through (d) without replacing said wafer.

2. The method of claim 1 wherein said predetermined time is the time necessary for said etch solution to remove approximately one half micron of said wafer surface.

3. The method of claim 1, wherein said wafer surface is a film of Mercury/Cadmium/Telluride.

4. The method of claim 3 wherein said etch solution is bromine-methanol.

5. The method of claim 3 wherein said predetermined time is between four and ten seconds.

6. The method of claim 3, wherein said etch solution is a one and a half percent solution of bromine in methanol.

7. The method of claim 6 wherein said predetermined time is the time necessary for said etch solution to remove approximately one half micron of said wafer surface.

8. The method of claim 6 wherein said predetermined time is between four and ten seconds.

9. A method of etching a wafer surface comprising:
   (a) placing a wafer having a surface to be etched into an etch container;
   (b) opening a first valve on a conduit connecting a reservoir containing a liquid etch solution and said etch container, to permit said etch solution to flow into said etch container and cover said wafer surface;
   (c) closing said first valve;
   (d) after a predetermined period of time opening a second valve on a conduit to drain said etch solution from said etch container;
   (e) repeating steps (b) through (d) without removing said wafer from said etch container.

10. The method of claim 9 wherein said predetermined period of time is the length of time necessary for said etch solution to etch approximately 0.5 micron thickness of said wafer surface.

11. The method of claim 9 additionally comprising repeating steps (b) through (d) a certain number of additional times without removing said wafer from said etch container.

12. The method of claim 11 wherein said surface to be etched is Mercury/Cadmium/Telluride.

13. The method of claim 12, wherein said etch solution is bromine-methanol.

14. The method of claim 13 wherein said predetermined period of time is between four and ten seconds.

15. The method of claim 13 wherein said predetermined period of time is the length of time for said etch solution to etch approximately 0.5 micron thickness of said wafer surface.

16. The method of claim 9 additionally comprising repeating steps (b) through (d) five additional times without removing said wafer from said etch container.

17. An apparatus for etching a wafer surface comprising:
   an etch container for holding a wafer;
   a reservoir for holding a quantity of etch solution;
   a first conduit for directing said etch solution from said reservoir to said etch container;
   a first valve on said first conduit;
   a second conduit for directing said etch solution from said etch container;
   a second valve on said second conduit;
   a timer/counter connected to said first and second valves to control said valves, wherein said timer/counter is configured to repeatedly perform the following steps:
   open said first valve while holding said second valve closed, to permit said etch solution to flow from said reservoir into said etch container;
   close said first valve and continue to hold said second valve closed for a predetermined period of time; and
   open said second valve after said predetermined period of time to drain said etch solution from said etch container.

* * * * *